US012719429B2

(12) United States Patent
Wada et al.

(10) Patent No.: US 12,719,429 B2
(45) Date of Patent: Aug. 25, 2026

(54) AMPLIFIER CIRCUIT

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Shotaro Wada, Nisshin (JP); Tomohiro Nezuka, Nisshin (JP); Yoshikazu Furuta, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 458 days.

(21) Appl. No.: 18/448,276

(22) Filed: Aug. 11, 2023

(65) Prior Publication Data

US 2024/0063766 A1 Feb. 22, 2024

(30) Foreign Application Priority Data

Aug. 17, 2022 (JP) ................................ 2022-130093

(51) Int. Cl.
*H03F 1/14* (2006.01)
*H03F 1/02* (2006.01)
*H03F 3/45* (2006.01)

(52) U.S. Cl.
CPC .................... *H03F 3/45475* (2013.01); *H03F 2203/45116* (2013.01); *H03F 2203/45528* (2013.01)

(58) Field of Classification Search
CPC ....... H03F 3/45475; H03F 2203/45116; H03F 2203/45528; H03F 2203/45048; H03F 2203/45526; H03F 2203/45534; H03F 3/387; H03F 1/26; H03F 2200/372; H03F 1/14; H03F 3/72; H03F 1/0277; H03F 1/02; H03F 1/303; H03F 3/005; H03G 1/0088
USPC ............................................. 330/9, 51, 252
See application file for complete search history.

(56) References Cited

U.S. PATENT DOCUMENTS 6,201,441 B1 * 3/2001 Suematsu ............ H03G 1/0088 330/136
7,224,220 B2 * 5/2007 Kakitani ............. H03G 1/0088 327/124
10,644,675 B2 5/2020 Ganta et al.
2022/0123700 A1 * 4/2022 Lee ...................... H03M 3/342

* cited by examiner

*Primary Examiner* — Khanh V Nguyen
(74) *Attorney, Agent, or Firm* — Posz Law Group, PLC

(57) ABSTRACT

An amplifier circuit includes: an amplifier; a first switched resistor unit configured by connecting in series a first resistance element having one or more resistors and a first switch, and having one end connected to an input terminal of the amplifier; a second resistance element unit connected between an other end of the first switched resistor unit and an output terminal of the amplifier and including one or more resistors; a second switch connected between a common connection point of the first switched resistor unit and the second resistance element unit and a reset potential point; and a control circuit for exclusively turning on and off the first switch and the second switch, respectively.

4 Claims, 12 Drawing Sheets

1
9a
6a
8a
7a
5a
Φ1
Φ2
RES
RES
Δqi
Δqr
4a
3a
Vinp
2
Vinm
3b
4b
RES
RES
5b
Φ1
8b
Φ2
6b
7b

RESET PHASE

OPERATION PHASE

Φ1

Φ2

Φ3

TIME 110
104
Vcm
Δqi
$\overline{D}$
112
R
D
111
C2
113
102
101
C1
105
Vin
103
Vout
109
106
Vcm
104

AMPLIFIER CIRCUIT

CROSS REFERENCE TO RELATED APPLICATIONS

The present application claims the benefit of priority from Japanese Patent Application No. 2022-130093 filed on Aug. 17, 2022. The entire disclosure of the above application is incorporated herein by reference.

TECHNICAL FIELD

The present disclosure relates to an amplifier circuit that includes a combination of an amplifier and a switched resistor unit that has a switch and a resistance element.

BACKGROUND

According to a conceivable technique, an amplifier circuit includes a combination of an amplifier and a switched resistor unit that has a switch and a resistance element.

SUMMARY

According to an example, an amplifier circuit may include: an amplifier; a first switched resistor unit configured by connecting in series a first resistance element having one or more resistors and a first switch, and having one end connected to an input terminal of the amplifier; a second resistance element unit connected between an other end of the first switched resistor unit and an output terminal of the amplifier and including one or more resistors; a second switch connected between a common connection point of the first switched resistor unit and the second resistance element unit and a reset potential point; and a control circuit for exclusively turning on and off the first switch and the second switch, respectively.

BRIEF DESCRIPTION OF THE DRAWINGS

The above and other objects, features and advantages of the present disclosure will become more apparent from the following detailed description made with reference to the accompanying drawings. In the drawings:

FIG. 4 is a diagram showing the configuration of an amplifier circuit in a third embodiment;

FIG. 13 is a diagram showing the configuration of an amplifier circuit in a seventh embodiment;

DETAILED DESCRIPTION

Figure 16:
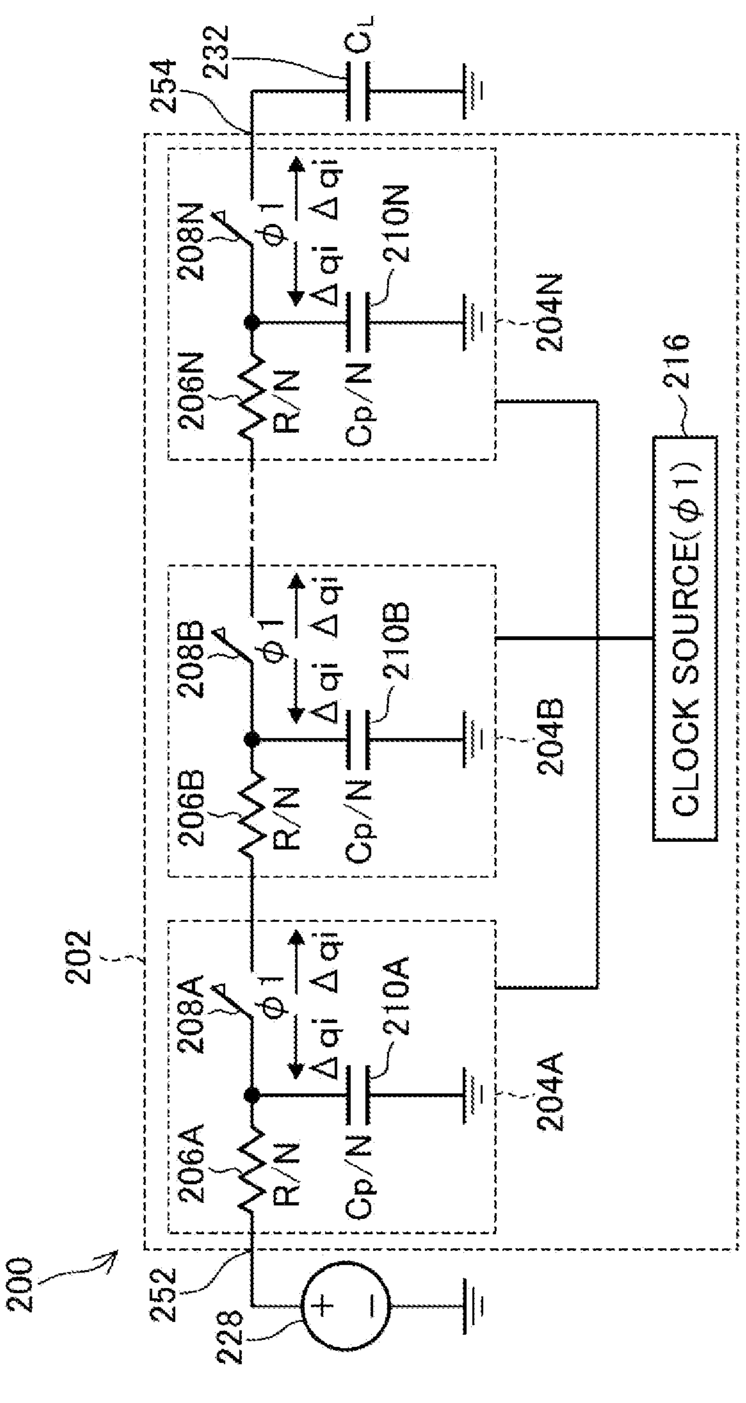
FIG. 16 is a diagram according to a conceivable technique.

FIG. 16 is a view according to a conceivable technique, which shows a stack-type switch resistance element that realizes a high-resistance resistor in an integrated circuit. The stack-type switch resistance element includes a plurality of segments connected in series. Each segment includes a resistor with its own parasitic capacitance and a switch connected in series with the resistor, and the switch connects and disconnects the resistor from the multiple segments in response to a predetermined clock signal.

Figures 17, 18A, 18B:
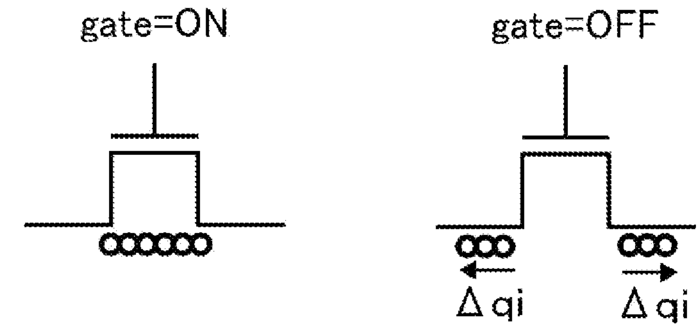
FIG. 17 is a diagram according to another conceivable technique.
FIGS. 18A and 18B are diagrams explaining a charge injection.

FIG. 17 is a diagram according to another conceivable technique, which shows an amplifier device having an amplifier with an inversion terminal and a non-inversion terminal connected to a reset voltage node, a first capacitor connected to the inversion terminal and applied an input voltage to the first capacitor, a second capacitor connected to the inversion terminal, an output terminal of the amplifier and a duty cycle resistor. A first resistor is connected in parallel with the second capacitor. The duty cycle resistor connects the first resistor and the inversion terminal and disconnects the first resistor and the reset voltage node at a first time interval included in the period of time to complete the on/off cycle of the resistor, and connects the first resistor and the reset voltage node and disconnects the first resistor and the inversion terminal at a second time interval included in the period.

In the above configuration, MOSFETs and the like are generally used as switches for connecting and disconnecting each element. As shown in FIG. 18A as a comparison example, when the MOSFET is turned on, electric charges are charged immediately below the gate terminal. Then, as shown in FIG. 18B, when the MOSFET is turned off, the charges charged in the gate are injected into the source terminal and the drain terminal. This injected charge provides an error $\Delta qi$. This phenomenon is defined as a charge injection. Hereinafter, the charge injection may be simply referred to as an injection.

Assuming that the configuration of the conceivable technique is mounted between the input terminal and the output terminal of an amplifier, it may take a long time for the bias of the input voltage to settle on the output side due to the presence of many segments. In addition, since all the switches are turned on and off at the same time, the influence of the error caused by the injection may increase before and after that timing. For example, when viewed from the node on the right side of the switch 208B, if the switch 208B in the subsequent stage is turned off later than the switch 208A in the preceding stage, the error $\Delta qi$ generated in the switch 208A may provide an error as it is. However, if the switch 208B is turned off earlier, the above error Δqi may not provide an error when viewed from the right side of the switch 208B.

Further, in the configuration of the other conceivable technique, if the switch 111 is turned off, the error Δqi directly appears at the inversion input terminal of the amplifier 109. Moreover, since the resistance element also has a parasitic capacitance, the electric charge charged in the parasitic capacitance may also appear as an error.

The present embodiments has been made in view of the above circumstances, and an object of the present disclosure is to provide an amplifier circuit in which the influence of an error provided by a charge generated when the switch is turned off and a charge in the parasitic capacitance is reduced as much as possible when using a configuration in which a switch and a resistance element are combined in an amplifier.

According to an amplifier circuit of the present embodiments, a first switched resistor unit is configured by connecting in series a first resistance element having one or more resistors and a first switch, and one end of the first switched resistor unit is connected to an input terminal of the amplifier. A second resistance element unit is connected between the other end of the first switched resistor unit and an output terminal of the amplifier, and a second switch is connected between a common connection point of the first switched resistor unit and the second resistance element and a reset potential point. A control circuit exclusively turns on the first switch and the second switch.

Since the first switch and the second switch are exclusively turned on, the influence of errors due to respective charge injections are not superimposed. Since the first resistance element and the first switch are connected in series, the influence of the error due to a parasitic capacitance of one of the first resistance element and the first switch may be directly affected, but the influence of the error due to a parasitic capacitance of the other one of the first resistance element and the first switch is relieved. These generally reduce the influence of errors due to the parasitic capacitance of each element.

First Embodiment

Figures 1, 2:
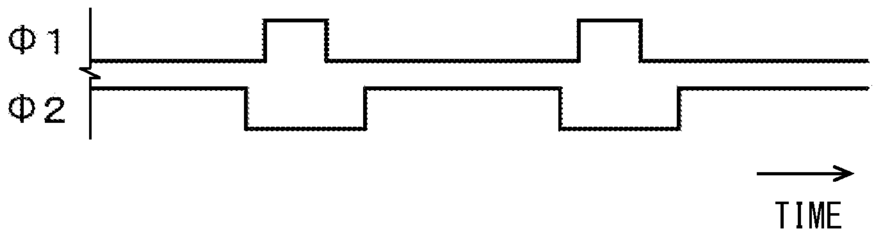
FIG. 1 is a diagram showing the configuration of an amplifier circuit in a first embodiment.
FIG. 2 is a timing chart showing control signals for each switch.

As shown in FIG. 1, the amplifier circuit 1 of the present embodiment includes a differential amplifier 2. Input voltages $V_{inp}$ and $V_{inm}$ are applied to the inversion input terminal and the non-inversion input terminal of the differential amplifier 2, via capacitors 3*a* and 3*b*, respectively. In the differential amplifier 2, the configuration of the positive side and the negative side is symmetrical, and "a" and "b" are attached to the respective reference numerals in the drawing. In the following, when there is no need to specify the configuration of the positive side and the negative side, the reference numerals "a" and "b" will not be added to the description.

A capacitor 4 corresponding to a first capacitance element is connected between the input terminal and the output terminal of the differential amplifier 2. A series circuit of a first switch 5, a first resistance element 6 and a second resistance element 7 is connected in parallel to the capacitor 4. A second switch 8 is connected between the common connection point of the first resistance element 6 and the second resistance element 7 and the ground. The ground is the reset potential point, and the ground potential corresponds to the reset potential. The first switch 5 and the first resistance element 6 constitute a first switched resistor unit 9. The second resistance element 7 corresponds to a second resistance element unit. The switches 5 and 8 are configured using, for example, N-channel MOSFETs.

The first switch 5 and the second switch 8 are controlled by control signals ϕ1 and ϕ2 output from a control circuit (not shown), respectively. When the controls signals ϕ1 and ϕ2 are in the low level, the first switch 5 and the second switch 8 are turned off, respectively. When the controls signals ϕ1 and ϕ2 are in the high level, the first switch 5 and the second switch 8 are turned on, respectively. In the drawing, the parasitic capacitance C of the first resistance element 6*a* is indicated by a broken line, and the charge charged in the parasitic capacitance C is defined by Δqr. Also, Δqi is the charge due to the charge injection that is generated when the first switch 5*a* is turned off. These charges Δqr, Δqi are defined as "errors".

As shown in FIG. 2, the periods in which the control signals ϕ1 and ϕ2 are at high level are set so as not to overlap, and the first switch 5 and the second switch 8 are controlled to be turned on exclusively. The amplifier circuit 1 is to be used when configuring, for example, a ΔΣ type ND converter.

Next, an operation of the present embodiment will be described. When the control signal ϕ2 becomes high level and the second switch 8 is turned on, the potential of the common connection point of the resistance elements 6 and 7 becomes the ground potential, which is the common mode voltage. When the control signal ϕ1 becomes high level and the first switch 5 is turned on, the charge injection occurs in the first switch 5. After that, when the first switch 5 is turned off, the error Δqi directly appears at the input terminal of the differential amplifier 2, but the error Δqr does not appear.

As described above, according to the present embodiment, the first switched resistor unit 9 is configured by connecting the first switch 5 and the first resistance element 6 in series, and one end thereof is connected to the input terminal of the amplifier 2. The second resistance element 7 is connected between the other end of the first switched resistor unit 9 and an output terminal of the amplifier 2, and a second switch 8 is connected between a common connection point of the first switched resistor unit 9 and the second resistance element 7 and a reset potential point. A control circuit exclusively turns on the first switch 5 and the second switch 8.

Since the first switch 5 and the second switch 8 are exclusively turned on, the influence of errors due to respective charge injections are not superimposed. By connecting the first switch 5 and the first resistance element 7 in series, the input terminal of the amplifier 2 is directly affected by the error Δqi due to the charge injection of the first switch 5, but is not affected by the other error Δqr. These generally reduce the influence of errors due to the parasitic capacitance of each element.

Second Embodiment

Figure 3:
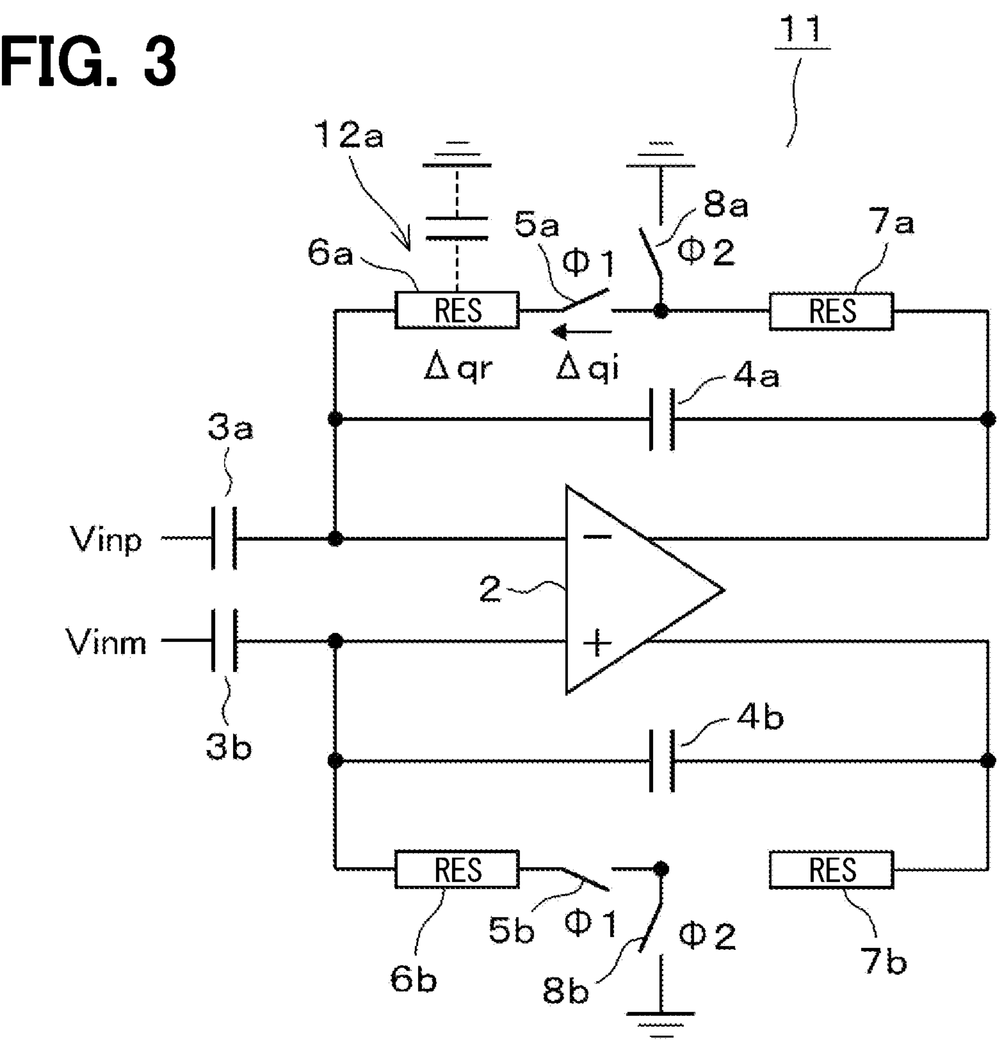
FIG. 3 is a diagram showing the configuration of an amplifier circuit in a second embodiment.

Hereinafter, the identical parts as those in the first embodiment will be designated by the same reference numerals for simplification of the description. Only differences from the first embodiment will be described below. As shown in FIG. 3, the amplifier circuit 11 of the second embodiment has a configuration in which the connection order of the first switch 5 and the first resistance element 6 of the first switched resistor unit 9 in the amplifier circuit 1 is changed. These constitute the first switched register unit 12. Since the first resistance element 6 is connected to the input terminal of the differential amplifier 2, an error Δqr appears at the input terminal, but the error Δqi is relieved by the presence of the first resistance element 6.

Third Embodiment

Figure 4:
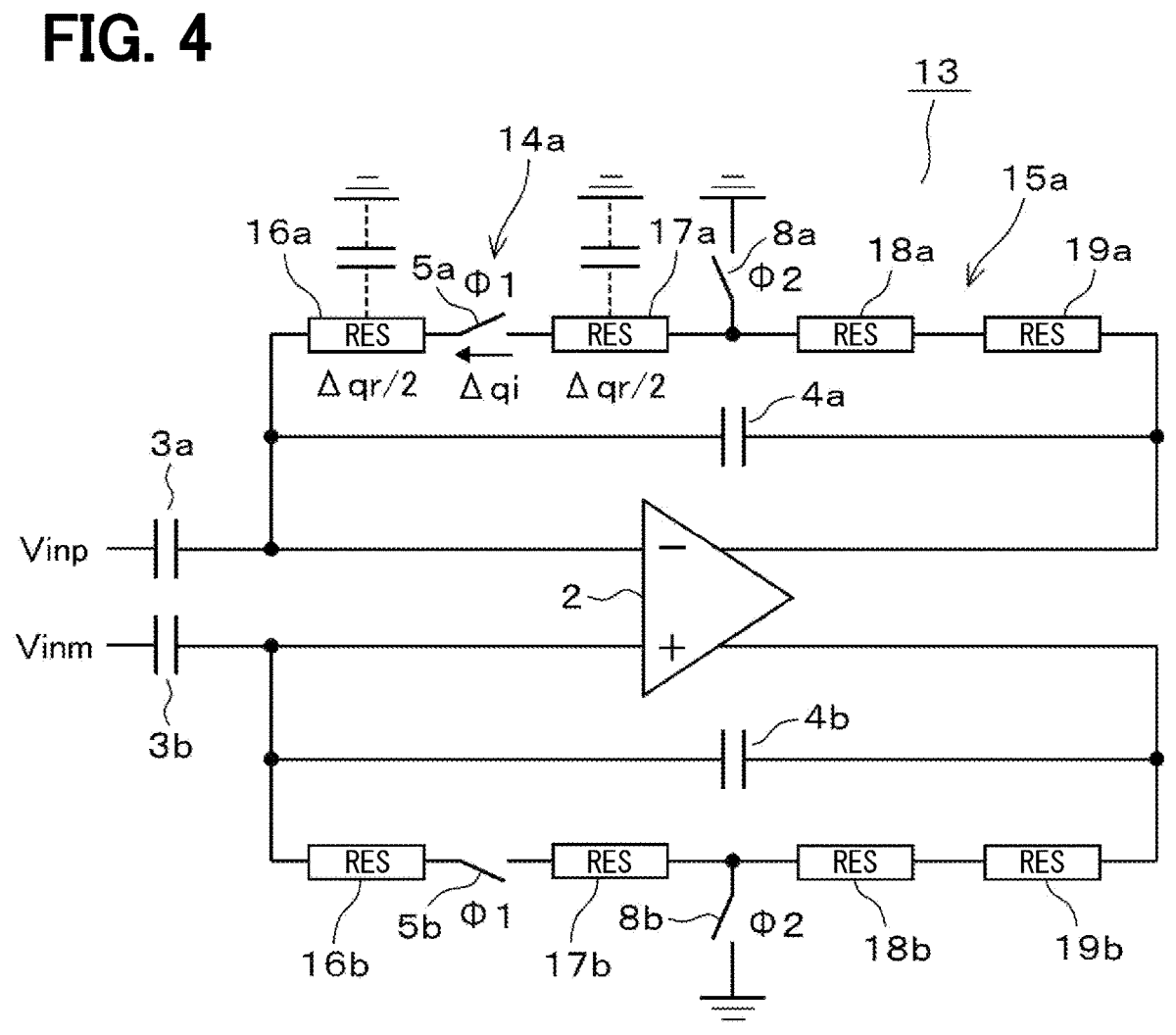

As shown in FIG. 4, the amplifier circuit 13 of the third embodiment includes a first switched resistor unit 14 and a second resistance element unit 15. The first switched resistor unit 14 includes a series circuit of a resistance element 16, a first switch 5 and a resistance element 17, and the second resistance element unit 15 includes a series circuit of a second switch 8, a resistance element 18 and a resistance element 19. The resistance elements 16 and 17 correspond to the first resistance element, and the resistance elements 18 and 19 correspond to the second resistance element unit.

When the resistance values of the resistance elements 6 and 7 are defined as R, the resistance values of the resistance elements 16 to 19 are set to R/2. Since the parasitic capacitance value of the resistive element is proportional to the resistance value, the error due to the parasitic capacitance of the resistive elements 16 to 19 is defined by Δqr/2. According to the amplifier circuit 13, as in the second embodiment, the error Δqi is relieved by interposing the first resistance element 6, and the error appearing at the input terminal of the differential amplifier 2 becomes smaller.

Fourth Embodiment

Figure 5:
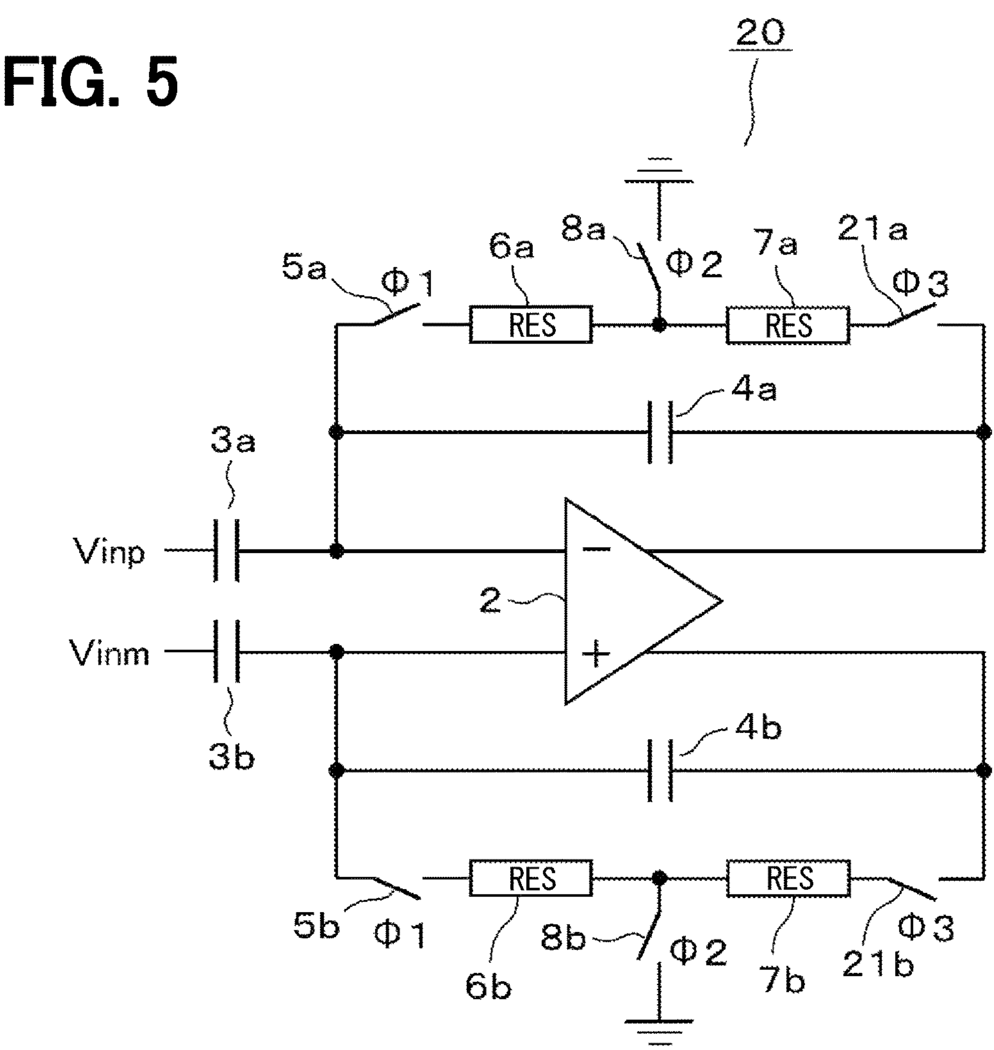
FIG. 5 is a diagram showing the configuration of an amplifier circuit in a fourth embodiment.
Figure 6:
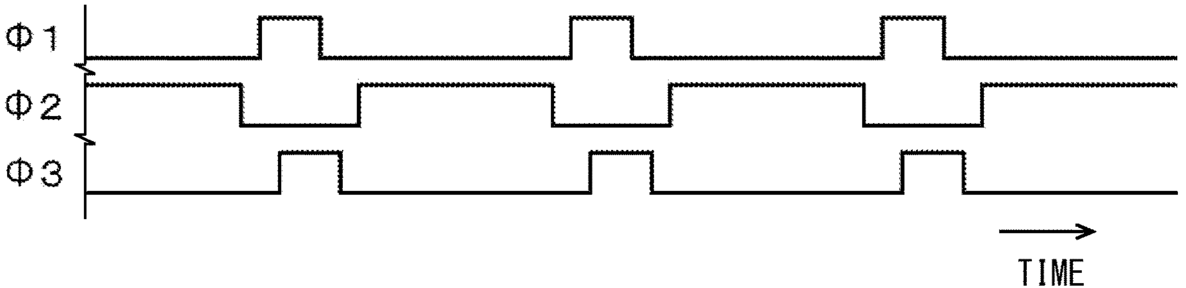
FIG. 6 is a timing chart showing control signals for each switch.

As shown in FIG. 5, the amplifier circuit 20 of the fourth embodiment has a configuration in which a third switch 21 is added between the resistance element 7 and the output terminal of the differential amplifier 2 in the amplifier circuit 1 of the first embodiment. The third switch 21 is controlled by a control signal ϕ3. As shown in FIG. 6, the period during which the control signal ϕ3 is at high level does not overlap with the control signal ϕ2 and is slightly delayed with respect to the control signal ϕ1. The delay degree to which the control signal ϕ3 is delayed with respect to the control signal ϕ1 is limited to the range in which the on state periods of both overlap.

Figure 7:
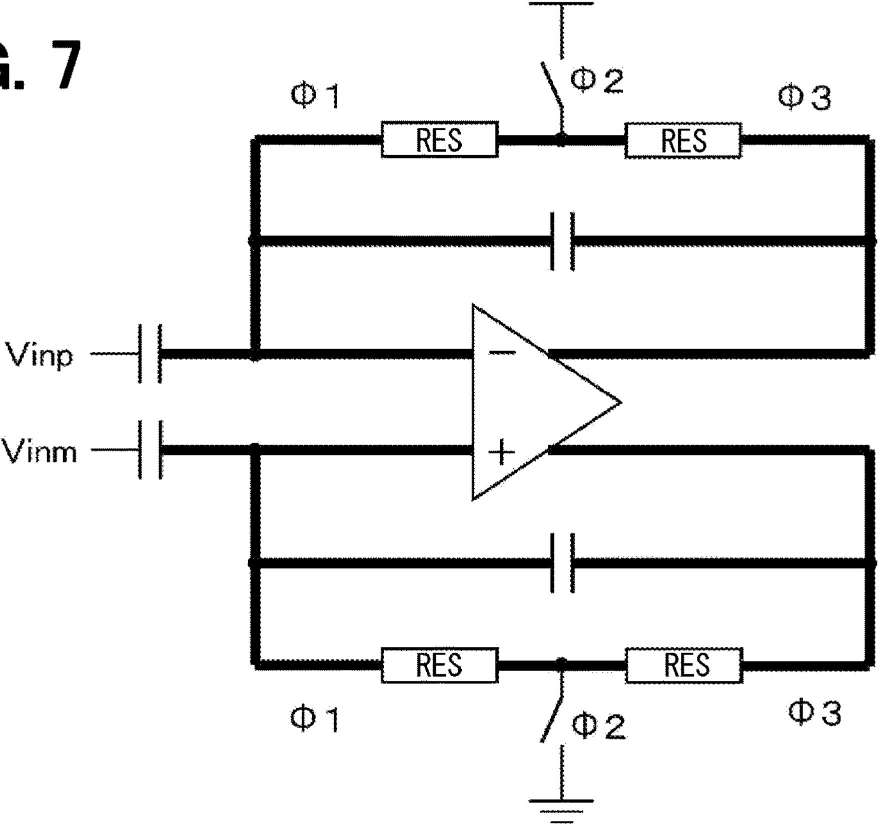
FIG. 7 is a diagram showing a wiring that is energized by turning on each switch in each phase of the timing chart shown in FIG. 6 (part 1)
Figure 8:
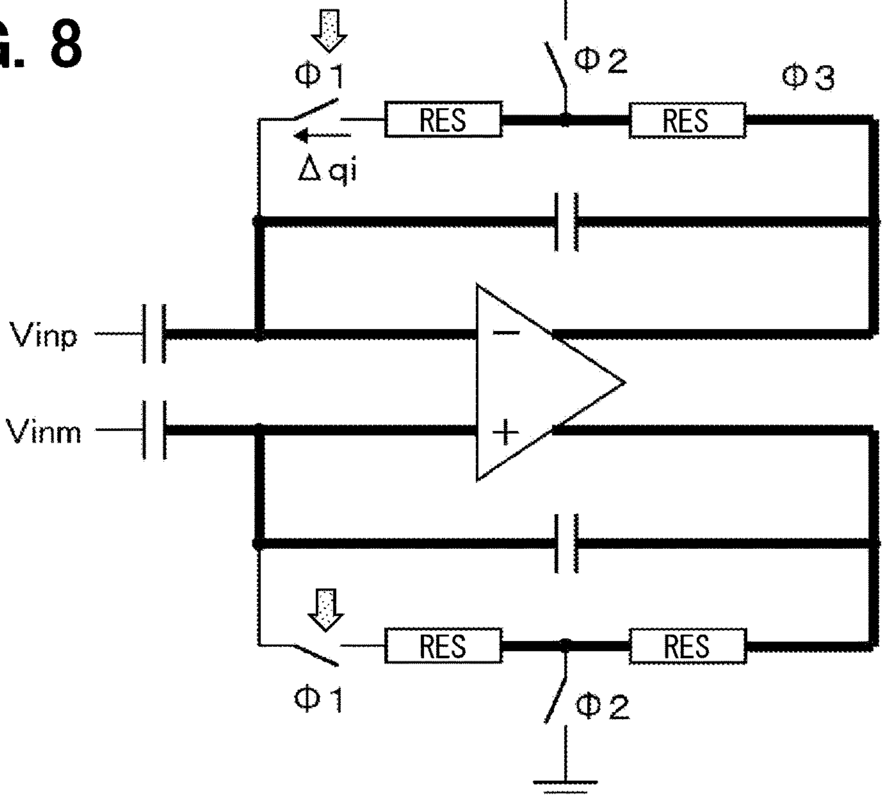
FIG. 8 is a diagram showing the wiring that is energized by turning on each switch (part 2)
Figure 9:
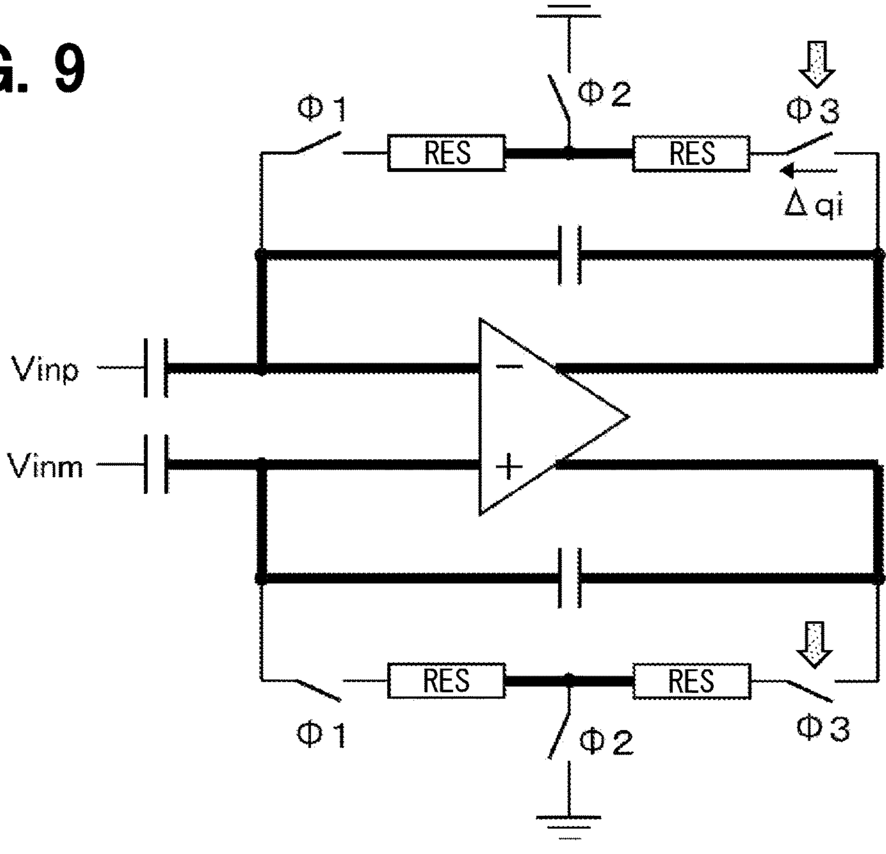
FIG. 9 is a diagram showing the wiring that is energized by turning on each switch (part 3)
Figure 10:
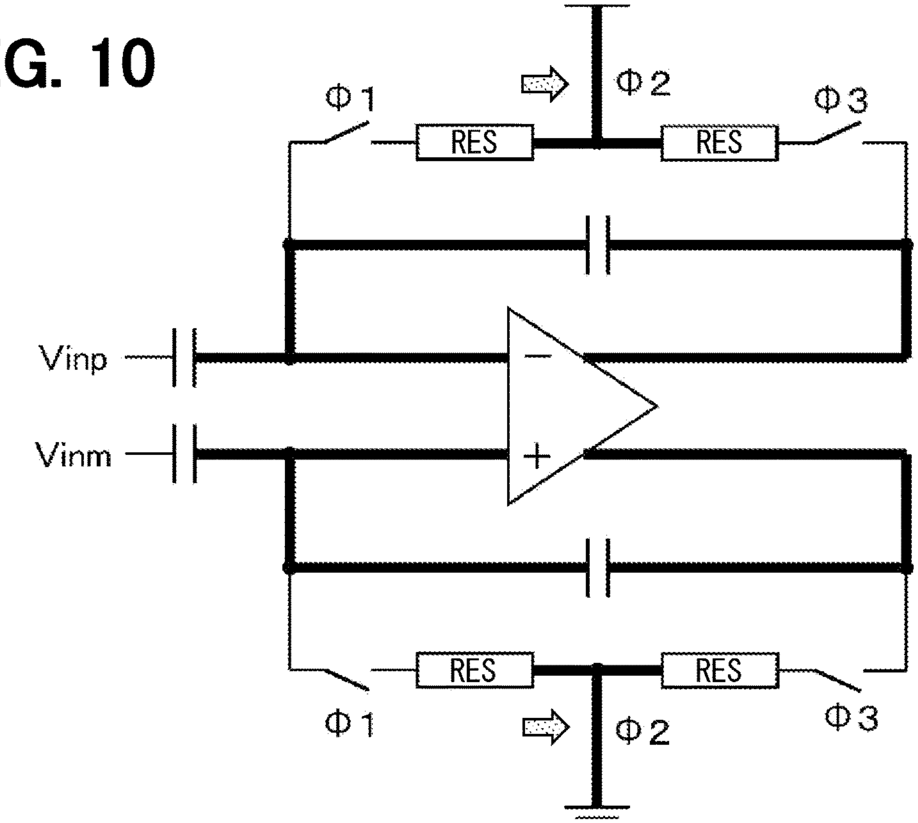
FIG. 10 is a diagram showing the wiring that is energized by turning on each switch (part 4)

FIGS. 7 to 10 correspond to each phase of the timing chart shown in FIG. 6, and thick lines indicate wirings that are energized when the switches 5, 8, and 21 are turned on. After the switches 5 and 21 are both turned on as shown in FIG. 7, the switch 5 is first turned off as shown in FIG. 8, so that the error Δqi appears at the input terminal of the differential amplifier 2. Subsequently, as shown in FIG. 9, the error Δqi is generated by turning off the switch 21, but since the switch 5 is turned off, the input terminal of the differential amplifier 2 is not affected. After that, as shown in FIG. 10, the switch 8 is turned on, and the common connection point of the resistance elements 6 and 8 becomes the ground potential.

Fifth Embodiment

Figure 11:
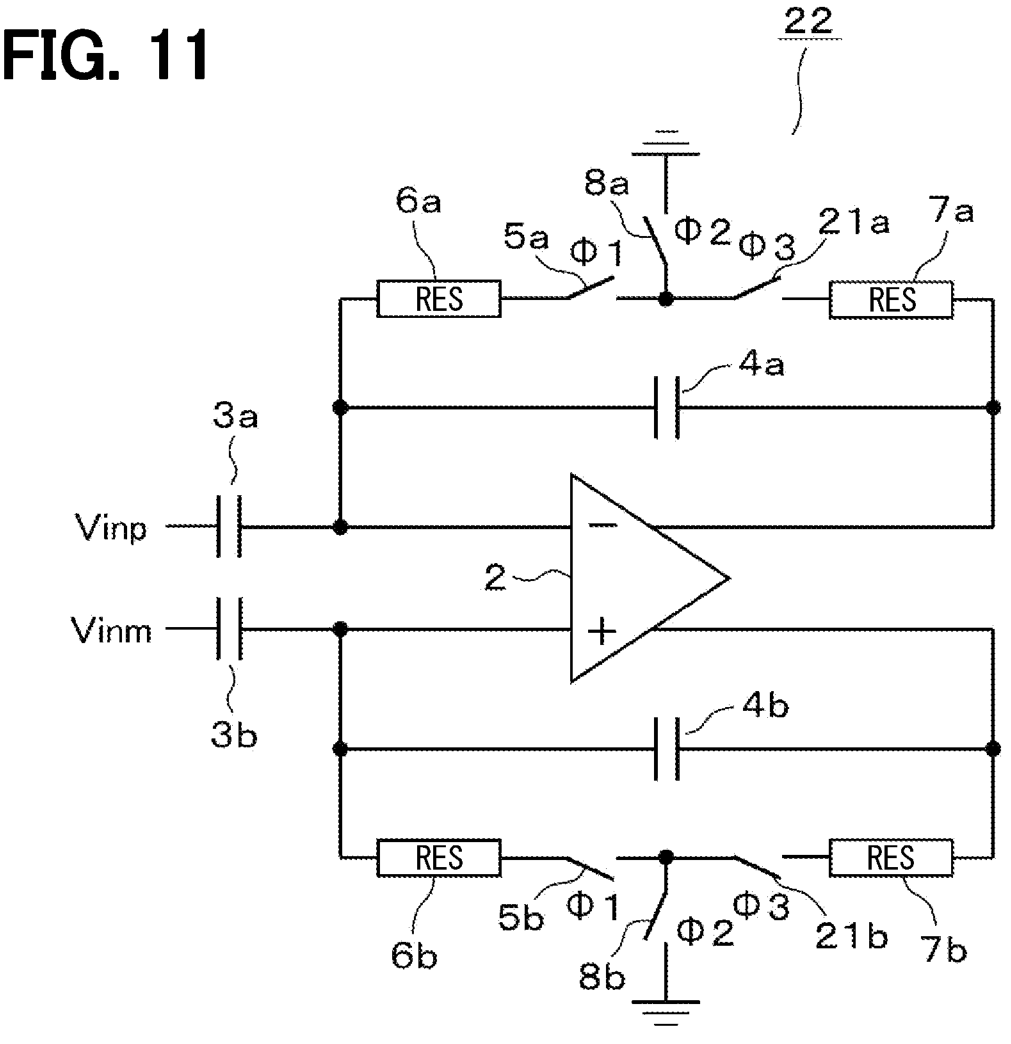
FIG. 11 is a diagram showing the configuration of an amplifier circuit in a fifth embodiment.

As shown in FIG. 11, the amplifier circuit 22 of the fifth embodiment has a configuration in which the switch 21 is connected between the switch 5 and the resistance element 7 in the amplifier circuit 11 of the second embodiment. As an effect, the effect of the second embodiment in addition to the effect of the fourth embodiment are obtained.

Sixth Embodiment

Figure 12:
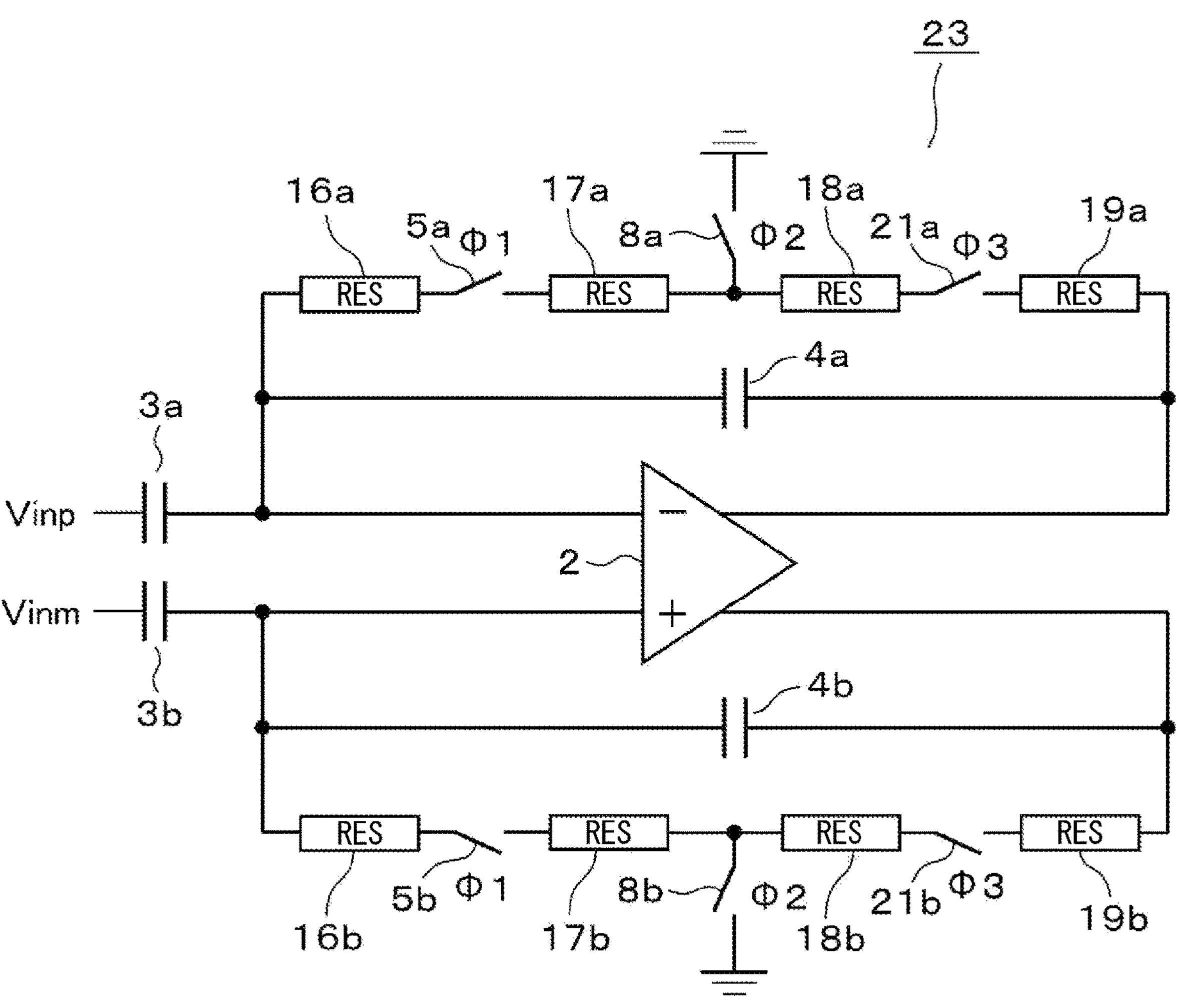
FIG. 12 is a diagram showing the configuration of an amplifier circuit in a sixth embodiment.

As shown in FIG. 12, the amplifier circuit 23 of the sixth embodiment has a configuration in which the switch 21 is connected between the resistance elements 18 and 19 in the amplifier circuit 13 of the third embodiment. As an effect, the effect of the third embodiment in addition to the effect of the fourth embodiment are obtained.

Seventh Embodiment

Figure 13:
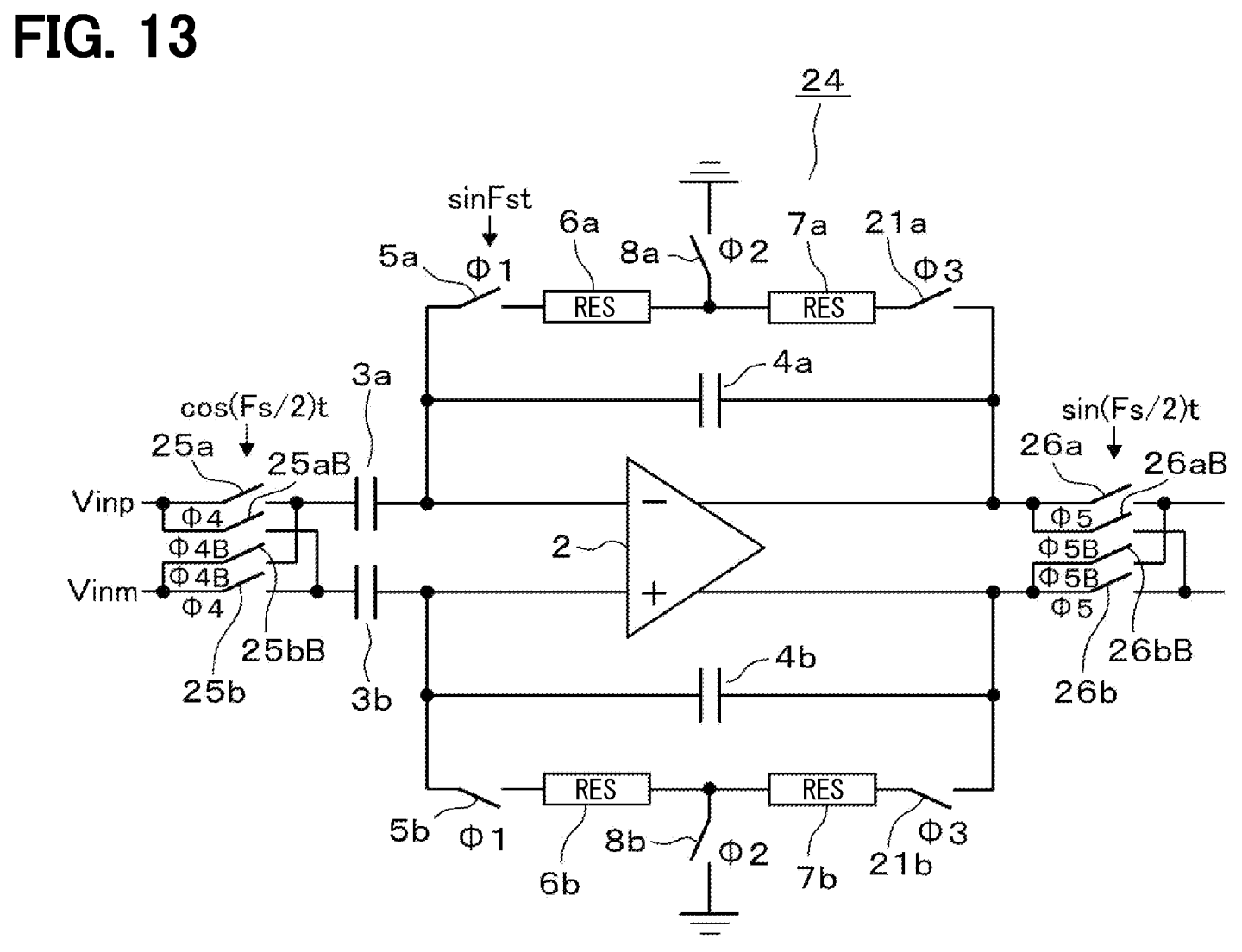

As shown in FIG. 13, the amplifier circuit 24 of the seventh embodiment has a configuration in which chopping switches 25 and 25B are connected to the preceding stage of the capacitor 3, and chopping switches 26 and 26B are connected to the output terminal of the differential amplifier 2 in the amplifier circuit 20 of the fourth embodiment. The chopping switches 25 and 25B are controlled by control signals ϕ4 and ϕ4B, respectively, and the chopping switches 26 and 26B are controlled by control signals ϕ5 and ϕ5B, respectively.

Figures 14, 15:
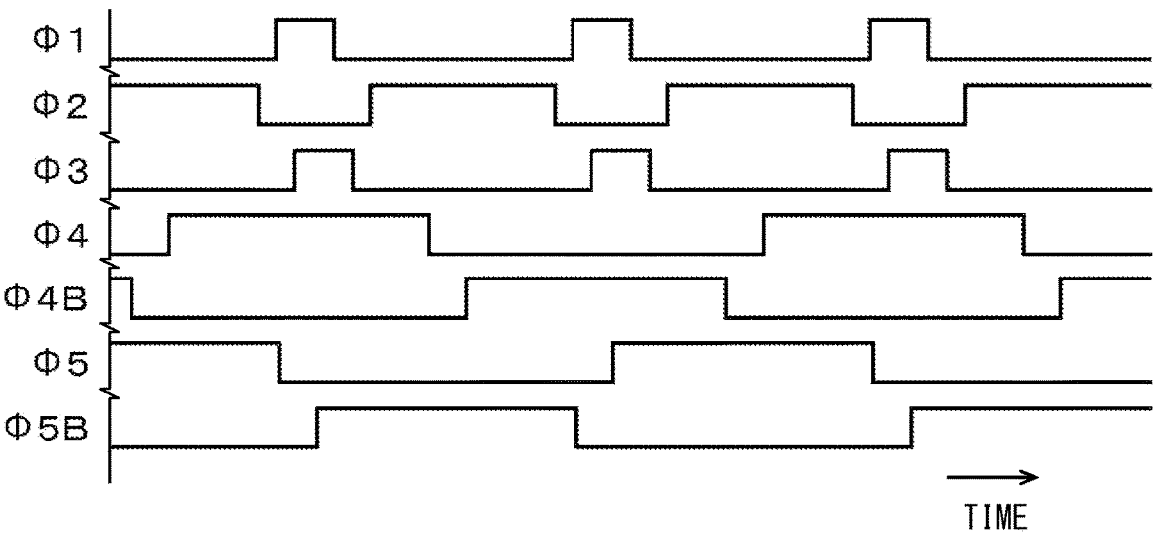
FIG. 14 is a timing chart showing control signals for each switch.
FIG. 15 is a timing chart showing control signals for each switch in an eighth embodiment.

As shown in FIG. 14, when the switching frequency of the control signal ϕ1 is defined as Fs, the switching frequencies of the control signals ϕ4 and ϕ4B and ϕ5 and ϕ5B are respectively defined by Fs/2. Further, the phases of the control signals ϕ5 and ϕ5B are 90 degrees behind the control signals ϕ4 and ϕ4B. When the frequency of the control signal ϕ1 is defined as "sin(Fst)", the frequency of the control signals ϕ4 and ϕ4B is defined by "cos(Fs/2)t", and the frequency of the control signals ϕ5 and ϕ5B is defined by "sin(Fs/2)t".

The chopping switch 25 or 25B is turned on for a period exceeding the length of the period, including the period during which the first switch 5 is turned on. By setting the control signals ϕ4 and ϕ4B not to switch at the timing when the control signals ϕ1 to ϕ3 are switched, errors caused in charge storage due to the on and off switching of the chopping switches 25 and 25B are reduced.

Eighth Embodiment

In the eighth embodiment, when the timing chart shown in FIG. 6 is the operation phase for the amplifier circuit 20 of the fourth embodiment, a reset phase is provided as shown in FIG. 15 before starting the operation phase. In the reset phase, the control signals ϕ1 and ϕ3 are set to high level, and the control signal ϕ2 is set to low level. As a result, the initial state of the amplifier circuit 20 is established.

Other Embodiments

The first to third switches may not be limited to N-channel MOSFETs, and may include other semiconductor elements.

The first resistance element and the second resistance element unit may include three or more resistance elements.

Although the present disclosure has been described in accordance with the embodiment, it is understood that the present disclosure is not limited to the embodiment and the structure. The present disclosure incorporates various modifications and variations within the scope of equivalents. In addition, various combinations and forms, and further, other combinations and forms including only one element, or more or less than these elements are also within the sprit and the scope of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An amplifier circuit comprising:

an amplifier;

a first switched resistor unit configured by connecting in series a first resistance element having one or more resistors and a first switch, and having one end connected to an input terminal of the amplifier;

a second resistance element unit connected between an other end of the first switched resistor unit and an output terminal of the amplifier and including one or more resistors;

a second switch connected between a common connection point of the first switched resistor unit and the second resistance element unit and a reset potential point;

a control circuit for exclusively turning on and off the first switch and the second switch, respectively; and a third switch arranged on an output terminal side of the amplifier from the first switch, and connected in series with the first switched resistor unit and the second resistance element unit, or in series with the first switched resistor unit or the second resistance element unit, wherein:

the control circuit delays an on and off timing of the third switch from an on and off timing of the first switch within a delay range in which an on-state period of the third switch overlaps an on-state period of the first switch.

2. The amplifier circuit according to claim 1, wherein:

a reset period is set before starting a circuit operation; and the control circuit turns on the first switch and the third switch and turns off the second switch during the reset period.

3. The amplifier circuit according to claim 1, further comprising:

a first capacitance element connected between the input terminal and the output terminal of the amplifier.

4. The amplifier circuit according to claim 3, further comprising:

an input side chopping switch;

a second capacitance element connected between the input side chopping switch and the input terminal of the amplifier; and an output side chopping switch connected to the output terminal of the amplifier, wherein:

when the control circuit drives the first switch at a predetermined phase timing with a frequency defined by Fs, the control circuit turns on the input side chopping switch at a frequency defined by Fs/2 for a period including an on state period of the first switch, and turns on the output side chopping switch at a frequency defined by Fs/2.

* * * * *